United States Patent
Bentsen et al.

(10) Patent No.: US 6,750,266 B2
(45) Date of Patent: Jun. 15, 2004

(54) MULTIPHOTON PHOTOSENSITIZATION SYSTEM

(75) Inventors: James G. Bentsen, North St. Paul, MN (US); Robert J. DeVoe, Oakdale, MN (US); Michael C. Palazzotto, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 280 days.

(21) Appl. No.: 10/033,507

(22) Filed: Dec. 28, 2001

(65) Prior Publication Data

US 2003/0139484 A1 Jul. 24, 2003

(51) Int. Cl.$^7$ .......................... G03F 7/038; G03F 7/004; C08J 3/28; G03C 1/725
(52) U.S. Cl. .................. 522/2; 522/7; 522/14; 522/16; 522/22; 522/25; 522/26; 522/27; 522/28; 522/29; 522/182; 522/170; 522/117; 430/270.1; 430/280.1; 430/281.1
(58) Field of Search ................ 522/2, 7, 14, 16, 522/22, 25, 26, 27, 28, 29, 182, 170, 117; 430/270.1, 280.1, 281.1

(56) References Cited

U.S. PATENT DOCUMENTS

| | | | |
|---|---|---|---|
| 3,018,262 A | | 1/1962 | Schroeder |
| 3,729,313 A | | 4/1973 | Smith |
| 3,741,769 A | | 6/1973 | Smith |
| 3,779,778 A | | 12/1973 | Smith et al. |
| 3,808,006 A | | 4/1974 | Smith |
| 3,954,475 A | | 5/1976 | Bonham et al. |
| 3,987,037 A | | 10/1976 | Bonham et al. |
| 4,250,053 A | | 2/1981 | Smith |
| 4,279,717 A | | 7/1981 | Eckberg et al. |
| 4,333,165 A | * | 6/1982 | Swainson et al. ........... 365/120 |
| 4,394,403 A | | 7/1983 | Smith |
| 4,394,433 A | | 7/1983 | Gatzke |
| 4,491,628 A | | 1/1985 | Ito et al. |
| 4,642,126 A | | 2/1987 | Zador et al. |
| 4,652,274 A | | 3/1987 | Boettcher et al. |
| 4,735,632 A | | 4/1988 | Oxman et al. |
| 4,751,138 A | | 6/1988 | Tumey et al. |
| 4,859,572 A | | 8/1989 | Farid et al. |
| 5,166,236 A | * | 11/1992 | Alexander et al. .......... 524/111 |
| 5,235,015 A | | 8/1993 | Ali et al. |
| 5,545,676 A | | 8/1996 | Palazzotto et al. |
| 5,674,698 A | * | 10/1997 | Zarling et al. ............. 435/7.92 |
| 5,753,346 A | | 5/1998 | Leir et al. |
| 5,856,373 A | | 1/1999 | Kaisaki et al. |
| 5,912,257 A | * | 6/1999 | Prasad et al. ............... 514/356 |
| 5,998,495 A | | 12/1999 | Oxman et al. |
| 6,025,406 A | | 2/2000 | Oxman et al. |
| 6,054,007 A | | 4/2000 | Boyd et al. |
| 6,312,860 B1 | * | 11/2001 | Gotoh et al. ................. 430/26 |

FOREIGN PATENT DOCUMENTS

| | | |
|---|---|---|
| WO | WO 94/07142 | 3/1994 |
| WO | WO 98 43072 | 10/1998 |
| WO | WO 0196409 | 12/2001 |
| WO | WO 01/96452 | 12/2001 |
| WO | WO 01/96915 | 12/2001 |
| WO | WO 01/96917 | 12/2001 |
| WO | WO 01/96952 | 12/2001 |
| WO | WO 01/96958 | 12/2001 |
| WO | WO 01/96959 | 12/2001 |
| WO | WO 01/96961 | 12/2001 |
| WO | WO 01/96962 | 12/2001 |

OTHER PUBLICATIONS

R.D. Allen et al., "193 nm Single Layer Positive Resists Building Etch Resistance Into a High Resolution Imaging System" SPIE vol. 2438, pp. 474–485. (1991).
Ko Wakabayashi et al., "Studies on s–Triazines. I. Contrimerization of Trichloracetonitrile with Other Nitriles", Bulletin of the Chemical Society of Japan, vol. 42, pp. 2924–2930.(1969).
R.D. Allen et al., "High Performance Acrylic Polymers for Chemically Amplified Photoresist Applications", J. Vac. Sci. Technol. B, 9, 3357 (1991).
D.F. Eaton, "Advances in Photchemistry", edited by B. Voman et al., vol. 13, pp 427–488. (1986).
M.P. Joshi et al., "Three–dimensional Optical Circuitry using Two–Photon–assisted Polymerization", Applied Physics Letters, vol. 74, pp. 170–172. (1999).
S. Shionoya et al., "Phosphor Handbook" Chap. 12, section 1, pp. 643–650. (1998).
A. Buroff et al., "New Photographic Material for Printed Circuits", pp. 205–210.
Denny et al., "Two–Photon Up–Converted Fluorescence Facilitated Photopolymerization", Polymer Preprints, vol. 41, No. 1, p. 3, 2000.
Cockcroft, "Application of Energy Upconversion Spectroscropy to Novel Laser and Phosphor Design", Journal of Alloys and Compounds, vol. 207/208, pp. 33–44, 1994.
Yi et al, "Investigation of Multiphoton Upconversion Thin Film Materials", Proceedings of the SPIE, vol. 3280, pp. 140–142, 1998.
Mita Y, "Phosphor Handbook", 1999 CRC Press XP008016062, p. 643–650.

\* cited by examiner

Primary Examiner—Susan Berman
(74) Attorney, Agent, or Firm—Lucy C. Weiss

(57) ABSTRACT

A multiphoton-activatable, photoreactive composition comprises: (a) at least one reactive species that is capable of undergoing an acid- or radical-initiated chemical reaction; (b) a photochemically-effective amount of a multiphoton photosensitizer comprising at least one multiphoton up-converting inorganic phosphor; and (c) a photochemically-effective amount of a one-photon photoinitiator system that is capable of being photosensitized by the multiphoton photosensitizer.

41 Claims, No Drawings

MULTIPHOTON PHOTOSENSITIZATION SYSTEM

FIELD

This invention relates to multiphoton-activatable, photoreactive compositions and to multiphoton methods of photoinducing chemical reactions.

BACKGROUND

Molecular two-photon absorption was predicted by Goppert-Mayer in 1931. Upon the invention of pulsed ruby lasers in 1960, experimental observation of two-photon absorption became a reality. Subsequently, two-photon excitation has found application in biology and optical data storage, as well as in other fields.

There are two key differences between two-photon induced photoprocesses and single-photon induced processes. Whereas single-photon absorption scales linearly with the intensity of the incident radiation, two-photon absorption scales quadratically. Higher-order absorptions scale with a related higher power of incident intensity. As a result, it is possible to perform multiphoton processes with three-dimensional spatial resolution. Also, because multiphoton processes involve the simultaneous absorption of two or more photons, the absorbing chromophore is excited with a number of photons whose total energy approximates the energy of an electronic excited state of the multiphoton photosensitizer that is utilized. Because the exciting light is not attenuated by single-photon absorption within a curable matrix or material, it is possible to selectively excite molecules at a greater depth within a material than would be possible via single-photon excitation by use of a beam that is focused to that depth in the material. These two phenomena also apply, for example, to excitation within tissue or other biological materials.

Major benefits have been achieved by applying multiphoton absorption to the areas of photocuring and microfabrication. For example, in multiphoton lithography or stereolithography, the nonlinear scaling of multiphoton absorption with intensity has provided the ability to write features having a size that is less than the diffraction limit of the light utilized, as well as the ability to write features in three dimensions (which is also of interest for holography). Such work has been limited, however, to slow writing speeds and high laser powers, due to the low photosensitivities of current multiphoton-activatable, photoreactive compositions.

SUMMARY

Thus, we recognize that there is a need for multiphoton-activatable, photoreactive compositions having improved photosensitivities that will enable faster writing speeds and the use of lower intensity light sources. The present invention provides such a multiphoton-activatable, photoreactive composition. The composition comprises: (a) at least one reactive species that is capable of undergoing an acid- or radical-initiated chemical reaction (preferably, a curable species; more preferably, a curable species selected from the group consisting of monomers, oligomers, and reactive polymers); (b) a photochemically-effective amount of a multiphoton photosensitizer comprising at least one multiphoton up-converting inorganic phosphor; and (c) a photochemically-effective amount of a one-photon photoinitiator system that is capable of being photosensitized by the multiphoton photosensitizer.

The composition of the invention exhibits enhanced multiphoton photosensitivity by using up-converting inorganic phosphors as multiphoton photosensitizers. The phosphors absorb two long-wavelength visible or near-infrared (NIR) photons of light to populate an excited state that re-emits one photon of visible or ultraviolet (UV) light (the "up-converted emission"), which can be used to induce chemical reaction through formation of reaction-initiating species (radicals, acid, etc.). Unlike the organic dyes commonly used as multiphoton photosensitizers, the phosphors can be excited at selected wavelengths to undergo sequential, rather than simultaneous, multiphoton absorption and (due to the long lifetime of the energy transfer state populated through absorption of a first photon) can be activated using compact, inexpensive laser diodes rather than expensive femtosecond or picosecond pulsed lasers. Thus, the composition of the invention satisfies the need that we have recognized for compositions that allow rapid fabrication of three-dimensional structures and that permit the use of lower intensity light sources for exposure.

In another aspect, this invention also provides a method of multiphoton photosensitizing a photoreactive composition. The method comprises (a) preparing the above-described multiphoton-activatable, photoreactive composition; and (b) irradiating the composition with light sufficient to cause sequential or simultaneous absorption of at least two photons, thereby inducing at least one acid- or radical-initiated chemical reaction where the composition is exposed to the light.

DETAILED DESCRIPTION

Definitions

As used in this patent application:

"multiphoton absorption" means the sequential or simultaneous absorption of two or more photons of electromagnetic radiation to reach a reactive, electronic excited state that is energetically inaccessible by the absorption of a single photon of the same energy;

"simultaneous" means two events that occur within the period of $10^{-14}$ seconds or less;

"multiphoton up-converting" means capable of undergoing multiphoton absorption followed by emission of a single photon of higher energy (shorter wavelength) than the photons absorbed;

"electronic excited state" means an electronic state of a molecule or ion that is higher in energy than its electronic ground state, that is accessible via absorption of electromagnetic radiation, and that has a lifetime greater than $10^{-13}$ seconds;

"cure" means to effect polymerization and/or to effect crosslinking;

"optical system" means a system for controlling light, the system including at least one element chosen from refractive optical elements such as lenses, reflective optical elements such as mirrors, and diffractive optical elements such as gratings. Optical elements shall also include diffusers, waveguides, and other elements known in the optical arts;

"three-dimensional light pattern" means an optical image wherein the light energy distribution resides in a volume or in multiple planes and not in a single plane;

"exposure system" means an optical system plus a light source;

"sufficient light" means light of sufficient intensity and appropriate wavelength to effect multiphoton absorption;

"photosensitizer" means a species that lowers the energy required to activate a photoinitiator system by absorbing light of lower energy than is required by the photoinitiator system for activation and interacting with the photoinitiator system (which is thereby "photosensitized") to produce a photoinitiating species therefrom; and "photochemically effective amounts" (of, for example, the components of the photoinitiator system) means amounts sufficient to enable the reactive species to undergo at least partial reaction under the selected exposure conditions (as evidenced, for example, by a change in density, viscosity, color, pH, refractive index, or other physical or chemical property).

Reactive Species

Reactive species suitable for use in the photoreactive compositions include both curable and non-curable species. Curable species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200–500, copolymerizable mixtures of acrylated monomers such as those of U.S. Pat. No. 4,652,274, and acrylated oligomers such as those of U.S. Pat. No. 4,642,126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acryl ate half ester resins such as Sarbox™ resins available from Sartomer (for example, Sarbox™ 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired. Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl)adipate. A more detailed list of useful epoxides of this nature is set forth in U.S. Pat. No. 3,117,099.

Other epoxy-containing materials that are useful include glycidyl ether monomers of the formula

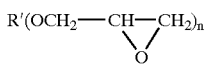

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations Epon™ 828, Epon™ 825, Epon™ 1004, and Epon™ 1010 from Resolution Performance Products, formerly Shell Chemical Co., as well as DER™-331, DER™-332, and DER™-334 from Dow Chemical Co.), vinylcyclohexene dioxide (for example, ERL-4206 from Union Carbide Corp.), 3,4- epoxycyclohexylmethyl-3,4-epoxycyclohexene carboxylate (for example, ERL-4221 or Cyracure™ UVR 6110 or UVR 6105 from Union Carbide Corp.), 3,4-epoxy-6-methylcyclohexylmethyl-3,4-epoxy-6-methyl-cyclohexene carboxylate (for example, ERL-4201 from Union Carbide Corp.), bis(3,4-epoxy-6-methylcyclohexylmethyl) adipate (for example, ERL-4289 from Union Carbide Corp.), bis(2, 3-epoxycyclopentyl) ether (for example, ERL-0400 from Union Carbide Corp.), aliphatic epoxy modified from polypropylene glycol (for example, ERL-4050 and ERL-4052 from Union Carbide Corp.), dipentene dioxide (for example, ERL-4269 from Union Carbide Corp.), epoxidized polybutadiene (for example, Oxiron™ 2001 from FMC Corp.), silicone resin containing epoxy functionality, flame retardant epoxy resins (for example, DER™-580, a brominated bisphenol type epoxy resin available from Dow Chemical Co.), 1,4-butanediol diglycidyl ether of phenol-formaldehyde novolak (for example, DEN™-431 and DEN™-438 from Dow Chemical Co.), resorcinol diglycidyl ether (for example, Kopoxite™ from Koppers Company, Inc.), bis(3,4-epoxycyclohexyl)adipate (for example, ERL-4299 or UVR-6128, from Union Carbide Corp.), 2-(3,4-epoxycyclohexyl-5,5-spiro-3,4-epoxy)cyclohexane-meta-dioxane (for example, ERL-4234 from Union Carbide Corp.), vinylcyclohexene monoxide 1,2-epoxyhexadecane (for example, UVR-6216 from Union Carbide Corp.), alkyl glycidyl ethers such as alkyl $C_8$–$C_{10}$ glycidyl ether (for example, Heloxy™ Modifier 7 from Resolution Performance Products), alkyl $C_{12}$–$C_{14}$ glycidyl ether (for example, Heloxy™ Modifier 8 from Resolution Performance Products), butyl glycidyl ether (for example, Heloxy™ Modifier 61 from Resolution Performance Products), cresyl glycidyl ether (for example, Heloxy™ Modifier 62 from Resolution Performance Products), p-tert-butylphenyl glycidyl ether (for example, Heloxy™ Modifier 65 from Resolution Performance Products), polyfunctional glycidyl ethers such as diglycidyl ether of 1,4-butanediol (for example, Heloxy™ Modifier 67 from Resolution Performance Products), diglycidyl ether of neopentyl glycol (for example, Heloxy™ Modifier 68 from Resolution Performance Products), diglycidyl ether of cyclohexanedimethanol (for example, Heloxy™ Modifier 107 from Resolution Performance Products), trimethylol ethane triglycidyl ether (for example, Heloxy™ Modifier 44 from Resolution Performance Products), trimethylol propane triglycidyl ether (for example, Heloxy™ Modifier 48 from Resolution Performance Products), polyglycidyl ether of an aliphatic polyol (for example, Heloxy™ Modifier 84 from Resolution Performance Products), polyglycol diepoxide (for example, Heloxy™ Modifier 32 from Resolution Performance Products), bisphenol F epoxides (for example, Epon™-1138 or GY-281 from Ciba-Geigy Corp.), and 9,9-bis[4-(2,3-epoxypropoxy)-phenyl]fluorenone (for example, Epon™ 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg), which are commercially available from the General Electric Company. These are polydimethylsiloxanes in which 1–20 mole % of the silicon atoms have been substituted with epoxyalkyl groups (preferably, epoxy cyclohexylethyl, as described in U.S. Pat. No. 5,753,346 (Kessel)).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the Epon™ resins available from Resolution Performance Products) and cycloaliphatic epoxies (such as ERL-4221 and ERL-4299 available from Union Carbide).

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (Rapi-Cure™ DVE-3, available from International Specialty Products, Wayne, N.J.), trimethylolpropane trivinyl ether (TMPTVE, available from BASF Corp., Mount Olive, N.J.), and the Vectomer™ divinyl ether resins from Allied Signal (for example, Vectomer™ 2010, Vectomer™ 2020, Vectomer™ 4010, and Vectomer™ 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-curable species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B. 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehydebased materials); and rearrangement (for example, materials based on the pinacol rearrangements).

Useful non-curable species also include leuco dyes, which tend to be colorless until they are oxidized by acid generated by the multiphoton photoinitiator system, and which, once oxidized, exhibit a visible color. (Oxidized dyes are colored by virtue of their absorbance of light in the visible portion of the electromagnetic spectrum (approximately 400–700 nm).) Leuco dyes useful in the present invention are those that are reactive or oxidizable under moderate oxidizing conditions and yet that are not so reactive as to oxidize under common environmental conditions. There are many such chemical classes of leuco dyes known to the imaging chemist.

Leuco dyes useful as reactive species in the present invention include acrylated leuco azine, phenoxazine, and phenothiazine, which can, in part, be represented by the structural formula:

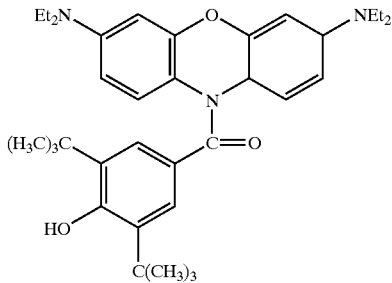
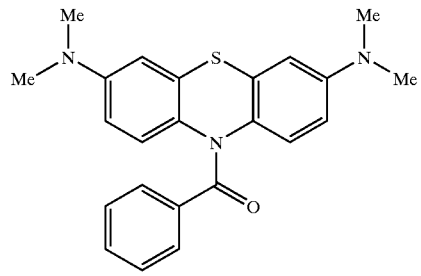
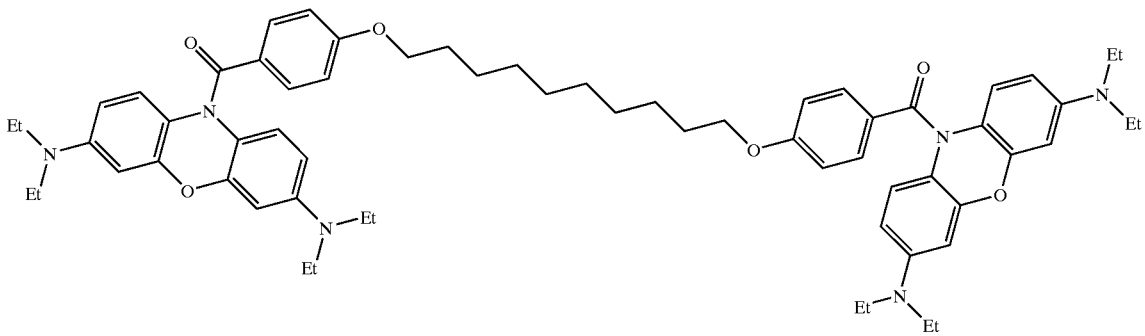

Copichem II

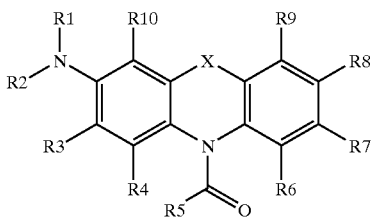

wherein X is selected from O, S, and —N—$R^{11}$, with S being preferred; $R^1$ and $R^2$ are independently selected from H and alkyl groups of 1 to about 4 carbon atoms; $R^3$, $R^4$, $R^6$, and $R^7$ are independently selected from H and alkyl groups of 1 to about 4 carbon atoms, preferably methyl; $R^5$ is selected from alkyl groups of 1 to about 16 carbon atoms, alkoxy groups of 1 to about 16 carbon atoms, and aryl groups of up to about 16 carbon atoms; $R^8$ is selected from —N($R^1$)($R^2$), H, alkyl groups of 1 to about 4 carbon atoms, wherein $R^1$ and $R^2$ are independently selected and defined as above; $R^9$ and $R^{10}$ are independently selected from H and alkyl groups of 1 to about 4 carbon atoms; and $R^{11}$ is selected from alkyl groups of 1 to about 4 carbon atoms and aryl groups of up to about 11 carbon atoms (preferably, phenyl groups). The following compounds are examples of this type of leuco dye:

Other useful leuco dyes include, but are not limited to, Leuco Crystal Violet (4,4',4"-methylidynetris-(N,N-dimethylaniline)), Leuco Malachite Green (p,p'-benzylidenebis-(N,N-dimethylaniline)), Leuco Atacryl Orange-LGM (Color Index Basic Orange 21, Comp. No. 48035 (a Fischer's base type compound)) having the structure.

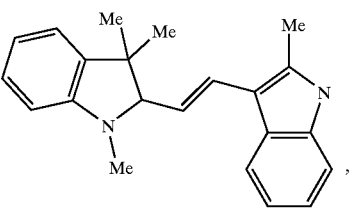

Leuco Atacryl Brilliant Red-4G (Color Index Basic Red 14) having the structure

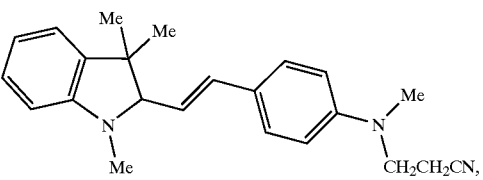

Leuco Atacryl Yellow-R (Color Index Basic Yellow 11, Comp. No. 48055) having the structure

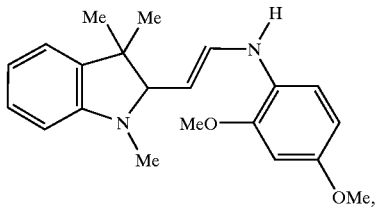

Leuco Ethyl Violet (4,4',4"-methylidynetris-(N,N-diethylaniline), Leuco Victoria Blu-BGO (Color Index Basic Blue 728a, Comp. No. 44040; 4,4'-methylidynebis-(N,N,-dimethylaniline)-4-(N-ethyl-1-napthalamine)), and LeucoAtlantic Fuchsine Crude (4,4',4"-methylidynetris-aniline).

The leuco dye(s) can generally be present at levels of at least about 0.01% by weight of the total weight of a light sensitive layer (preferably, at least about 0.3% by weight; more preferably, at least about 1% by weight; most preferably, at least about 2% to 10% or more by weight). Other materials such as binders, plasticizers, stabilizers, surfactants, antistatic agents, coating aids, lubricants, fillers, and the like can also be present in the light sensitive layer.

If desired, mixtures of different types of reactive species can be utilized in the photoreactive compositions. For example, mixtures of free-radically-reactive species and cationically-reactive species, mixtures of curable species and non-curable species, and so forth, are also useful.

Multiphoton Photosensitizer

Multiphoton up-converting inorganic phosphors suitable for use as multiphoton photosensitizers in the multiphoton-activatable, photoreactive composition of the invention include those that comprise at least one host material that is doped with at least one rare earth activator couple. The activator couple comprises a pair of rare earth ions, one of which (the absorber) is capable of sequential long-wavelength visible or near-infrared (about 500 nm to about 1700 mn) multiphoton absorption, followed by two or more sequential or nonradiative energy transfers to excite the other (the emitter) to a multiply excited state, which then emits a single photon of higher energy (UV or visible) than the photons absorbed. (See, for example, the discussion by Yoh Mita in Chapter 12, Section 1 of *Phosphor Handbook*, edited by Phosphor Research Society, CRC Press, pages 643–50, New York (1999).) The absorber or the emitter can alternatively undergo simultaneous absorption of two or more long wave length visible or near-infrared photons, followed by emission of a single higher energy photon. Thus, the phosphors contain optically matched pairs of rare earth ions coordinated within a ceramic host lattice.

Suitable host materials include metal oxysulfides (for example, lanthanum oxysulfide, gadolinium oxysulfide, and yttrium oxysulfide), metal oxyhalides (for example, ytterbium oxyfluoride), metal fluorides (for example, sodium yttrium fluoride ($NaYF_4$), gadolinium fluoride ($GdF_3$), barium yttrium fluoride ($BaYF_5$, $BaY_2F_8$), yttrium fluoride ($YF_3$), and lanthanum fluoride ($LaF_3$)), metal gallates (for example, yttrium gallate), and metal silicates (for example, yttrium aluminum garnet), and the like, and mixtures thereof. Organic host materials (for example, chelating small molecules or polymers) can also be utilized.

Suitable activator couples include ytterbium/erbium, ytterbium/terbium, ytterbium/thulium, ytterbium/holmium, and the like, and mixtures thereof. Other activator couples suitable for multiphoton up-conversion can also be used. By combination of the host materials with the activator couples, at least three phosphors with at least three different emission spectra (red, green, and blue visible light) can be obtained. Generally, the absorber is ytterbium, and the emitter can be selected from erbium, holmium, terbium, and thulium, as shown in Table I below. However, other absorbers and/or emitters can also be utilized.

TABLE 1

Useful Phosphor Compositions

| Host Material | Absorber Ion | Emitter Ion | Color |
|---|---|---|---|
| Oxysulfides ($O_2S$) | | | |
| $Y_2O_2S$ | Ytterbium | Erbium | Green |
| $Gd_2O_2S$ | Ytterbium | Erbium | Red |
| $La_2O_2S$ | Ytterbium | Holmium | Green |
| Oxyhalides (OX y) | | | |
| YOF | Ytterbium | Thulium | Blue |
| $Y_3OCl_7$ | Yterbium | Terbium | Green |
| Fluorides ($F_x$) | | | |
| $YF_3$ | Ytterbium | Erbium | Red |
| $GdF_3$ | Ytterbium | Erbium | Green |
| $LaF_3$ | Ytterbium | Holmium | Green |
| $NaYF_3$ | Ytterbium | Thulium | Blue |
| $BaYF_5$ | Ytterbium | Thulium | Blue |
| $BaY_2F_8$ | Ytterbium | Terbium | Green |
| Gallates ($Ga_xO_y$) | | | |
| $YGaO_3$ | Ytterbium | Erbium | Red |
| $Y_3Ga_5O_{12}$ | Ytterbium | Erbium | Green |
| Silicates ($Si_xO_y$) | | | |
| $YSi_2O_5$ | Ytterbium | Holmium | Green |
| $YSi_3O_7$ | Ytterbium | Thulium | Blue |

In addition to the phosphors shown in Table I and variations thereof, metal aluminates, metal phosphates, metal oxides, and metal vanadates can be suitable phosphor host materials. In general, when silicates are used as a host material, the conversion efficiency is relatively low. Hybrid up-converting phosphors are also useful (for example, combining one or more host materials and/or one or more absorber ions and/or one or more emitter ions).

The molar ratio of absorber: emitter is typically at least about 1:1, more usually at least about 3:1 to 5:1, preferably at least about 8:1 to 10:1, more preferably at least about 11:1 to 20:1, and typically less than about 250:1, usually less than about 100:1, and more usually less than about 50:1 to 25:1, although various ratios can be selected on the basis of desired characteristics (for example, chemical properties, manufacturing efficiency, absorption cross-section, excitation and emission wavelengths, quantum efficiency, or other considerations). The ratio(s) chosen will generally also depend upon the particular activator couple(s) selected, and can be calculated from reference values in accordance with the desired characteristics.

The optimum ratio of absorber (for example, ytterbium) to emitter (for example, erbium, thulium, or holmium) varies, depending upon the specific activator couple. For example, the absorber:emitter ratio for Yb:Er couples is typically in the range of about 20:1 to about 100:1, whereas the absorber:emitter ratio for Yb:Tm and Yb:Ho couples is typically in the range of about 500:1 to about 2000:1. These different ratios are attributable to the different matching energy levels of the Er, Tm, or Ho with respect to the Yb level in the crystal. For most applications, up-converting phosphors can conveniently comprise about 10–30% Yb and either about 1–2% Er, about 0.1–0.05% Ho, or about 0.1–0.05% Tm, although other formulations can also be employed.

Useful inorganic phosphors include those that are capable of multiphoton absorption of long-wave length visible or near-infrared radiation. Such phosphors typically have single-photon emission maxima that are in the visible or UV range. For example, ytterbium-erbium couples have emission maxima in the red or green portions of the visible spectrum, depending upon the phosphor host; ytterbium-holmium couples generally emit maximally in the green portion; ytterbium-thulium couples typically have an emission maximum in the blue range; and ytterbium-terbium couples usually emit maximally in the green range. For example, $Y_{0.80}Yb_{0.19}Er_{0.01}F_2$ emits maximally in the green portion of the spectrum.

Thus, up-converting inorganic phosphors of various formulae are suitable for use in the composition of the invention. Such phosphors include, for example, the following:

$Na(Y_xYb_yEr_z)F_4$: x is 0.7 to 0.9, y is 0.09 to 0.29, and z is 0.05 to 0.01;

$Na(Y_xYb_yHo_z)F_4$: x is 0.7 to 0.9, y is 0.0995 to 0.2995, and z is 0.0005 to 0.001;

$Na (Y_xYb_yTm_z)F_4$: x is 0.7 to 0.9, y is 0.0995 to y is 0.2995, and z is 0.0005 to 0.001; and $(Y_xYb_yEr_z)O_2S$ : x is 0.7 to 0.9, y is 0.05 to 0.12; z is 0.05 to 0.12.

$(Y_{0.86}Yb_{0.08}Er_{0.06})_2O_3$ is a relatively efficient up-converting phosphor.

The up-converting phosphors can generally be used in the form of polycrystalline particles. Useful particles are typically smaller than about 7 microns in average diameter, preferably less than about 3 microns in average diameter, more preferably less than about 1 micron in average diameter, and most preferably from about 0.1 to about 0.3 microns or less in average diameter. It is generally most preferred that the particles be as small as possible, while retaining sufficient quantum conversion efficiency to be photochemically effective. However, for any particular application, the size of the particle(s) can be selected at the discretion of the practitioner. Some applications can require a highly sensitive phosphor that need not be small but must have high conversion efficiency and/or absorption cross-section, while other applications can require a very small phosphor particle that is readily dispersible in the reactive species, but which need not have high conversion efficiency.

Thus, the optimal size of phosphor particle is application dependent and can be selected by the practitioner on the basis of quantum conversion efficiency data. Such data can be obtained from readily available sources (for example, handbooks and published references) or can be obtained by generating a standardization curve by measuring quantum conversion efficiency as a function of particle size. For example, it has been reported that $(Y-Yb-Er)O_2S$ particles having an average diameter of 300 nm exhibit a two-photon phosphorescence cross-section of $1\times10^{-42}$ $cm^4s/photon$. (See, for example, the data reported by Zarling et al. in International Patent Application No. WO94/07142, where a phosphorescence cross section of $1\times10^{-16}cm^2$ is reported for excitation at 975 nm at an intensity of 20 $W/cm^2$.) Furthermore, the phosphorescence intensity of the particles scales with the third power of the particle diameter (see, for example, FIG. 16 of WO94/07142), which implies a first order dependence on the number of absorber ions in the particle. These scaling factors can be used in selecting an appropriate particle size for a particular application.

Since up-conversion in the phosphors is a multiphoton process, the quantum efficiency of up-conversion varies as a power law relationship with the excitation intensity, at least until the phosphor begins to saturate. Some evidence exists for competition between two-photon and three-photon processes in the phosphors. Empirically, in the solid state, the emission intensity, $I_{em}$, scales with the third order of the excitation intensity, $I_{ex}$ (that is, $I_{em} \alpha I_{ex}^3$). This can be achieved at excitation powers as low as 0.1 $W/cm^2$ of continuous wave excitation. In solution, a second order dependence ($I_{em} \alpha I_{ex}^2$) can be observed with an onset near 1 $W/cm^2$ of continuous wave excitation.

Ytterbium (Yb)-erbium (Er)-doped yttrium oxysulfides luminesce in the green after excitation at 950 nm. These are non-linear phosphors, in that the ytterbium acts as an "antenna" (absorber) for two 950 nm photons and transfers its energy to erbium, which acts as an emitter (activator). The two-photon phosphorescence cross-section of the phosphor depends on the particle size and also on the doping level of the ions of the activator couple. For example, the doping level of both Yb and Er can generally be in the range of about 1 to 10 percent, more usually in the range of about 2 to 5 percent. A typical Yb:Er phosphor comprises about 10–30% Yb and about 1–2% Er. The nonlinear relationship between absorption and emission indicates that intense illumination at the excitation wavelength(s) can be necessary to obtain satisfactory emission when employing very small phosphor particles (that is, less than about 0.3 $\mu m$ in average diameter). Additionally, it is usually desirable to increase the doping levels of activator couples for producing very small phosphor particles, so as to maximize quantum conversion efficiency.

Methods for the manufacture of inorganic phosphors have been described in the literature. Such methods include, but are not limited to, those described by Yocom et al. in Metallurgical Transactions 2, 763 (1971); by Kano et al. in J. Electrochem. Soc., 119, 1561 (1972); by Wittke et al. in J. Appl. Physics 43, 595 (1972); by Van Uitert et al. in Mat. Res. Bull. 4, 381 (1969); by Jouart J P and Mary G in J. Luminescence 46, 39 (1990); by McPherson G L and Meyerson S L in Chem. Phys. Lett. 179 (April), 325 (1991); by Oomen et al. in J. Luminescence 46, 353 (1990); by N I H and Rand S C in Optics Lett. 16 (Sept.), 1424 (1991); by McFarlane R A in Optics Lett. 16 (Sept.), 1397 (1991); by Koch et al. in Appl. Phys. Lett. 56, 1083 (1990); by Silversmith et al. in Appl. Phys. Lett. 51, 1977 (1987); by Lenth W and McFarlane R M in J. Luminescence 45, 346 (1990); by Hirao et al. in J. Noncrystalline Solids 135, 90 (1991); and by McFarlane et al. in Appl. Phys. Lett. 52, 1300 (1988); the descriptions of which are incorporated herein by reference.

The resulting phosphor particles can be milled to a desired average particle size and distribution by conventional milling methods, including, for example, milling in a conventional barrel mill with zirconia and/or alumina balls for periods of up to about 48 hours or longer. Fractions having a particular particle size range can be prepared by sedimentation, generally over an extended period (that is, a day or more), with removal of the desired size range fraction after the appropriate sedimentation time. The sedimentation process can be monitored (for example, using a Horiba Particle Analyzer).

To facilitate dispersibility in the photoreactive composition, the phosphor particles can be coated or treated with one or more surface-active, compatibilizing agents (for example, mercaptans) during the milling process or after milling is completed. For example, particles can be coated with sulfhydryl-functional organic compounds. Other compatibilizing agents can also be utilized. For example, the particles can be treated with organosilanes (for example, alkyl chlorosilanes, trialkoxy arylsilanes, or trialkoxy alkylsilanes) or with other chemical compounds (for example, organotitanates) that are capable of attaching to the surface of the particles by a chemical bond (covalent or ionic) or by a strong physical bond, and that are chemically compatible with the chosen reactive species. Treatment with organosilanes is generally preferred. When aromatic ring-containing epoxy resins are utilized as the reactive species, surface treatment agents that also contain at least one aromatic ring are generally compatible with the resin and are thus preferred.

A particularly useful phosphor has the chemical formula $(Y_{0.86}Yb_{0.08}Er_{0.06})O_2S$. This and similar phosphors can generally be prepared by precipitating yttrium hydroxycarbonate in the presence of ytterbium (3+) and erbium (3+) dopants (for example, the hydroxycarbonates), followed by conversion to the oxysulfide in $H_2S/H_2O$ vapor at 840° C., and then sintering at 1500° C. under argon to produce the active material. The $Yb^{3+}$ absorber ion exhibits a narrow, but intense atomic absorption band centered at 980 nm. The energetics of the Yb-Er pair are such that the excited state of $Yb^{3+}$ can transfer its energy to a first metastable excited state of the $Er^{3+}$ ion, reabsorb a second photon, and then transfer that energy to the $Er^{3+}$ as well, to generate a higher energy excited state of $Er^{3+}$ that emits predominantly green emission peaks at 549 nm and 555 nm (from the transition $^4S_{3/2} \rightarrow {}^4I_{15/2}$), and also a red band at 660 nm (from the transition $^4F_{9/2} \rightarrow {}^4I_{15/2}$). The spectral intensities are different in different host materials. Oxide hosts favor red emission, while oxysulfide and fluoride hosts favor a mix of green and red emission. Different emitters can be used with the same absorber to provide different combinations of emission colors. The Yb-Ho pairs emit predominantly in the green, with little red emission. Yb-Tm pairs emit blue light at 480 nm.

One-Photon Photoinitiator System

The one-photon photoinitiator system can be a one-component, a two-component, or a three-component system. A one-component system comprises a photochemically effective amount of at least one one-photon photoinitiator that has an electronic absorption band that overlaps with an up-converted electronic emission band of the multiphoton photosensitizer (that is, a compound that is capable of absorbing the light emitted by the multiphoton photosensitizer and generating a reaction-initiating species). Examples of such compounds include free radical photoinitiators that generate a free radical source or cationic photoinitiators that generate an acid (including either protic or Lewis acids) when exposed to radiation having a wavelength in the ultraviolet or visible portion of the electromagnetic spectrum.

Useful free-radical photoinitiators include acetophenones, benzophenones, aryl glyoxalates, acylphosphine oxides, benzoin ethers, benzil ketals, thioxanthones, chloroalkyltriazines, bisimidazoles, triacylimidazoles, pyrylium compounds, sulfonium and iodonium salts, mercapto compounds, quinones, azo compounds, organic peroxides, and mixtures thereof. Examples of such photoinitiators are described, for example, in U.S. Pat. No. 4,735,632 (see column 3, line 26–47), and U.S. Pat No. 6,054,007 (see column 16, line 58, through column 17, line 7), which descriptions are incorporated herein by reference.

Useful cationic photoinitiators include metallocene salts having an onium cation and a halogen-containing complex anion of a metal or metalloid. Other useful cationic photoinitiators include iodonium salts and sulfonium salts, as well as metallocene salts having an organometallic complex cation and a halogen-containing complex anion of a metal or metalloid (as further described, for example, in U.S. Pat. No. 4,751,138 (see, for example, column 6, line 65, through column 9, line 45) and U.S. Pat. No. 5,238,744 (see column 10, line 12, through column 11, line 3), which descriptions are incorporated herein by reference). Mixtures of photoinitiators are also useful.

Such free-radical photoinitiators and cationic photoinitiators and methods for their preparation are known in the art. Many are commercially available.

Alternatively, useful two-component and three-component one-photon photoinitiator systems comprise photochemically effective amounts of (1) at least one one-photon photosensitizer having an electronic absorption band that overlaps with an up-converted electronic emission band of the multiphoton photosensitizer; and (2) either or both of (i) at least one electron donor compound different from the one-photon photosensitizer and capable of donating an electron to an electronic excited state of the one-photon photosensitizer (preferably, an electron donor compound having an oxidation potential that is greater than zero and less than or equal to that of p-dimethoxybenzene); and (ii) at least one photoinitiator that is capable of being photosensitized by accepting an electron from an electronic excited state of the one-photon photosensitizer, resulting in the formation of at least one free radical and/or acid (preferably, a photoinitiator selected from the group consisting of iodonium salts, sulfonium salts, diazonium salts, azinium salts, chloromethylated triazines, and triarylimidazolyl dimers).

(1) One-Photon Photosensitizers

One-photon photosensitizers suitable for use in the one-photon photoinitiator system of the photoreactive compositions are those having at least one electronic absorption band that overlaps with at least one up-converted electronic emission band of the multiphoton photosensitizer. Thus, the selection of a one-photon photosensitizer will depend upon the particular multiphoton photosensitizer that is utilized. However, the one-photon photosensitizer is preferably capable of light absorption somewhere within the range of wavelengths between about 300 and about 800 nanometers (more preferably, between about 400 and about 700 nanometers; and, most preferably, between about 400 and about 600 nanometers), as preferred multiphoton photosensitizers generally emit light of such wavelengths.

Preferably, the one-photon photosensitizer is substantially free of functionalities that would substantially interfere with the reaction of the reactive species and is soluble in the reactive species (if the reactive species is liquid) or is compatible with the reactive species and with any binders (as described below) that are included in the composition. Most preferably, the one-photon photosensitizer is also capable of sensitizing 2-methyl-4,6-bis(trichloromethyl)-s-triazine under continuous irradiation in a wavelength range that overlaps the single photon absorption spectrum of the one-photon photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (Butvar™ B76, Monsanto); 0.3 parts trimethylolpropane trimethacrylate; and 0.03 parts 2-methyl-4,6-bis(trichloromethyl)-s-triazine (see Bull. Chem. Soc. Japan, 42, 2924–2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis (trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a one-photon photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Suitable one-photon photosensitizers are believed to include compounds in the following categories: ketones, coumarin dyes (for example, ketocoumarins), xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes, and pyridinium dyes. Xanthene dyes, ketones (for example, monoketones or alpha-diketones), ketocoumarins, aminoarylketones, and p-substituted aminostyryl ketone compounds are preferred one-photon photosensitizers. Mixtures of photosensitizers can also be utilized. For applications requiring high sensitivity, it is generally preferred to employ a one-photon photosensitizer containing a julolidinyl moiety.

A preferred class of ketone photosensitizers comprises those represented by the following general formula:

ACO(X)$_b$B where X is CO or $CR^1R^2$, where $R^1$ and $R^2$ can be the same or different and can be hydrogen, alkyl, alkaryl, or aralkyl; b is zero; and A and B can be the same or different and can be substituted (having one or more non-interfering substituents) or unsubstituted aryl, alkyl, alkaryl, or aralkyl groups, or together A and B can form a cyclic structure that can be a substituted or unsubstituted alicyclic, aromatic, heteroaromatic, or fused aromatic ring.

Suitable ketones of the above formula include monoketones (b=0) such as 2,2'-, 4,4'-, or 2,4'-dihydroxybenzophenone, di-2-pyridyl ketone, di-2-furanyl ketone, di-2-thiophenyl ketone, benzoin, fluorenone, chalcone, Michler's ketone, 2-fluoro-9-fluorenone, 2-chlorothioxanthone, acetophenone, benzophenone, 1- or 2-acetonaphthone, 9-acetylanthracene, 2-, 3- or 9-acetylphenanthrene, 4-acetylbiphenyl, propiophenone, n-butyrophenone, valerophenone, 2-, 3- or 4-acetylpyridine, 3-acetylcoumarin, and the like. Suitable diketones include aralkyldiketones such as anthraquinone, phenanthrenequinone, o-, m- and p-diacetylbenzene, 1,3-, 1,4-, 1,5-, 1,6-, 1,7- and 1,8-diacetylnaphthalene, 1,5-, 1,8- and 9,10-diacetylanthracene, and the like. Suitable alpha-diketones (b=1 and x=CO) include 2,3-butanedione, 2,3-pentanedione, 2,3-hexanedione, 3,4-hexanedione, 2,3-heptanedione, 3,4-heptanedione, 2,3-octanedione, 4,5-octanedione, benzil, 2,2'-3,3'- and 4,4'-dihydroxylbenzil, furil, di-3,3'-indolylethanedione, 2,3-bomanedione (camphorquinone), biacetyl, 1,2-cyclohexanedione, 1,2-naphthaquinone, acenaphthaquinone, and the like.

Preferred ketocoumarins and p-substituted aminostyryl ketone compounds include 3-(p-dimethylaminocinnamoyl)-7-dimethyl-aminocoumarin, 3-(p-dimethylaminocinnamoyl)-7-dimethyl-aminocoumarin, 3-(p-diethylaminocinnamoyl)-7-dimethyl-aminocoumarin, 3-(p-diethylaminocinnamoyl)-7-dimethyl-aminocoumarin, 9'-julolidine-4-piperidinoacetophenone, 9'-julolidine-4-piperidinoacetophenone, 9-(4-diethylaminocinnamoyl)-1,2,4,5-tetrahydro-3H,6H,10H[1]benzopyrano[6,7,8-i,j]quinolizine-10-one, 9-(4-diethylaminocinnamoyl)-1,2,4,5-tetrahydro-3H,6H,10H[1]benzopyrano[6,7,8-i,j]quinolizine-10-one, 9-(4-dicyanoethylaminocinnamoyl)-1,2,4,5-tetra-hydro-3H,6H,10H[1]benzopyrano[6,7,8-i,j]-quinolizine-10-one, 9-(4-dicyanoethylaminocinnamoyl)-1,2,4,5-tetra-hydro-3H,6H,10H[1]benzopyrano[6,7,8-i,j]-quinolizine-10-one, 2,3-bis(9'-julolidine)cyclopentanone, 2,3-bis(9'-julolidine)cyclopentanone, 9-ethoxycarbonyl-1,2,4,5-tetrahydro-3H,6H,10H-[1]benzopyrano[6,7,8-i,j] quinolizine-10-one, 9-ethoxycarbonyl-1,2,4,5-tetrahydro-3H,6H,10H-[1]benzopyrano[6,7,8-i,j]quinolizine-10-one, 2-(4'-diethylaminobenzylidene)-1-indanone, 2-(4'-diethylaminobenzylidene)-1-indanone, 9-acetyl-1,2,4,5-tetrahydro-3H,6H,10H[1]benzo-pyrano[6,7,8-i,j] quinolizine-10-one, 9-acetyl-1,2,4,5-tetrahydro-3H,6H,10H [1]benzopyrano[6,7,8-i,j]quinolizine-10-one, 5,10-diethoxy-12,16,17-trichloroviolanthrene, and 5,10-diethoxy-12,16,17-trichloroviolanthrene, and the like.

Particularly preferred one-photon photosensitizers include rose bengal (that is, 4,5,6,7-tetrachloro-2',4',5',7'-tetraiodo fluorescein disodium salt (CAS 632-69-9)), camphorquinone, glyoxal, biacetyl, 3,3,6,6-tetramethylcyclohexanedione, 3,3,7,7-tetramethyl-1,2-cycloheptanedione, 3,3,8,8-tetramethyl-1,2-cyclooctanedione, 3,3,18,18-tetramethyl-1,2-cyclooctadecanedione, dipivaloyl, benzil, furil, hydroxybenzil, 2,3-butanedione, 2,3-pentanedione, 2,3-hexanedione, 3,4-hexanedione, 2,3-heptanedione, 3,4-heptanedione, 2,3-octanedione, 4,5-octanedione, and 1,2-cyclohexanedione. Of these, rose bengal is most preferred.

(2) Electron Donor Compounds

Electron donor compounds useful in the one-photon photoinitiator system of the photoreactive compositions are those compounds (other than the one-photon photosensitizer itself) that are capable of donating an electron to an electronic excited state of the one-photon photosensitizer. Such compounds may be used, optionally, to increase the one-photon photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.)

In general, electron donor compounds suitable for use with particular one-photon photosensitizers and photoinitiators can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970). The potentials reflect relative energy relationships and can be used in the following manner to guide electron donor compound selection:

When the one-photon photosensitizer is in an electronic excited state, an electron in the highest occupied molecular orbital (HOMO) of the one-photon photosensitizer has been lifted to a higher energy level (namely, the lowest unoccupied molecular orbital (LUMO) of the one-photon photosensitizer), and a vacancy is left behind in the molecular orbital it initially occupied. The photoinitiator can accept the electron from the higher energy orbital, and the electron donor compound can donate an electron to fill the vacancy in the originally occupied orbital, provided that certain relative energy relationships are satisfied.

If the reduction potential of the photoinitiator is less negative (or more positive) than that of the one-photon photosensitizer, an electron in the higher energy orbital of the one-photon photosensitizer is readily transferred from the one-photon photosensitizer to the lowest unoccupied molecular orbital (LUMO) of the photoinitiator, since this represents an exothermic process. Even if the process is instead slightly endothermic (that is, even if the reduction potential of the one-photon photosensitizer is up to 0.1 volt more negative than that of the photoinitiator) ambient thermal activation can readily overcome such a small barrier.

In an analogous manner, if the oxidation potential of the electron donor compound is less positive (or more negative) than that of the one-photon photosensitizer, an electron moving from the HOMO of the electron donor compound to the orbital vacancy in the one-photon photosensitizer is moving from a higher to a lower potential, which again represents an exothermic process. Even if the process is slightly endothermic (that is, even if the oxidation potential of the one-photon photosensitizer is up to 0.1 volt more positive than that of the electron donor compound), ambient thermal activation can readily overcome such a small barrier.

Slightly endothermic reactions in which the reduction potential of the one-photon photosensitizer is up to 0.1 volt more negative than that of the photoinitiator, or the oxidation potential of the one-photon photosensitizer is up to 0.1 volt more positive than that of the electron donor compound, occur in every instance, regardless of whether the photoinitiator or the electron donor compound first reacts with the one-photon photosensitizer in its excited state. When the photoinitiator or the electron donor compound is reacting with the one-photon photosensitizer in its excited state, it is preferred that the reaction be exothermic or only slightly endothermic. When the photoinitiator or the electron donor compound is reacting with the one-photon photosensitizer ion radical, exothermic reactions are still preferred, but still more endothermic reactions can be expected in many instances to occur. Thus, the reduction potential of the one-photon photosensitizer can be up to 0.2 volt (or more) more negative than that of a second-to-react photoinitiator, or the oxidation potential of the one-photon photosensitizer can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427–488, John Wiley and Sons, New York (1986); by Oxman et al. in U.S. Pat. No. 6,025,406 at column 7, lines 42–61; and by Palazzotto et al. in U.S. Pat. No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$ borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, $(allyl)Sn(CH_3)_3$, and $(benzyl)Sn(n-C_3H_7)_3$, ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino)methylsilane, N,N-diethylaminotrimethylsilane, tris(dimethylamino)phenylsilane, tris(methylsilyl)amine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include

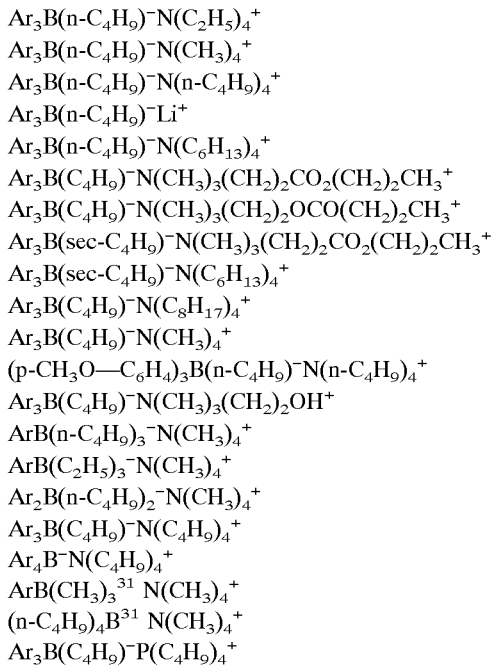

$Ar_3B(n-C_4H_9)^-N(C_2H_5)_4^+$
$Ar_3B(n-C_4H_9)^-N(CH_3)_4^+$
$Ar_3B(n-C_4H_9)^-N(n-C_4H_9)_4^+$
$Ar_3B(n-C_4H_9)^-Li^+$
$Ar_3B(n-C_4H_9)^-N(C_6H_{13})_4^+$
$Ar_3B(C_4H_9)^-N(CH_3)_3(CH_2)_2CO_2(CH_2)_2CH_3^+$
$Ar_3B(C_4H_9)^-N(CH_3)_3(CH_2)_2OCO(CH_2)_2CH_3^+$
$Ar_3B(sec-C_4H_9)^-N(CH_3)_3(CH_2)_2CO_2(CH_2)_2CH_3^+$
$Ar_3B(sec-C_4H_9)^-N(C_6H_{13})_4^+$
$Ar_3B(C_4H_9)^-N(C_8H_{17})_4^+$
$Ar_3B(C_4H_9)^-N(CH_3)_4^+$
$(p-CH_3O-C_6H_4)_3B(n-C_4H_9)^-N(n-C_4H_9)_4^+$
$Ar_3B(C_4H_9)^-N(CH_3)_3(CH_2)_2OH^+$
$ArB(n-C_4H_9)_3^-N(CH_3)_4^+$
$ArB(C_2H_5)_3^-N(CH_3)_4^+$
$Ar_2B(n-C_4H_9)_2^-N(CH_3)_4^+$
$Ar_3B(C_4H_9)^-N(C_4H_9)_4^+$
$Ar_4B^-N(C_4H_9)_4^+$
$ArB(CH_3)_3^{31} N(CH_3)_4^+$
$(n-C_4H_9)_4B^{31} N(CH_3)_4^+$
$Ar_3B(C_4H_9)^-P(C_4H_9)_4^+$ (where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

(3) Photoinitiators for Two-Component and Three-Component Photoinitiator Systems Suitable photoinitiators (that is, electron acceptor compounds) for the reactive species of the photoreactive compositions include those that are capable of being photosensitized by accepting an electron from an electronic excited state of the one-photon photosensitizer, resulting in the formation of at least one free radical and/or acid. Such photoinitiators include iodonium salts (for example, diaryliodonium salts), chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2'oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The photoinitiator is preferably soluble in the reactive species and is preferably shelf-stable (that is, does not spontaneously promote reaction of the reactive species when dissolved therein in the presence of the photosensitizers and the electron donor compound). Accordingly, selection of a particular photoinitiator can depend to some extent upon the particular reactive species, photosensitizers, and electron donor compound chosen, as described above. If the reactive species is capable of undergoing an acid-initiated chemical reaction, then the photoinitiator is an onium salt (for example, an iodonium, sulfonium, or diazonium salt).

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as $Cl^-$, $Br^-$, $I^-$ or $C_4H_5SO_3^-$) or a metal complex salt (for example, containing $SbF_6^-$, $PF_6^-$, $BF_4^-$, tetrakis(perfluorophenyl)borate, $SbF_5OH^{31} AsF_6^-$). Mixtures of iodonium salts can be used if desired.

Examples of useful aromatic iodonium complex salt photoinitiators include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl) iodonium hexafluorophosphate; di(4-chlorophenyl) iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl) iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., *J. Am. Chem. Soc.* 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SarCat™ CD 1012 obtained from Sartomer Company), and mixtures thereof.

Useful chloromethylated triazines include those described in U.S. Pat. No. 3,779,778 (Smith et al.) at column 8, lines 45–50, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954,475 (Bonham et al.).

Useful diazonium salts include those described in U.S. Pat. No. 4,394,433 (Gatzke), which comprise a light sensitive aromatic moiety (for example, pyrrolidine, morpholine, aniline, and diphenyl amine) with an external diazonium group (—N$^+$≡N) and an anion (for example, chloride, tri-isopropyl naphthalene sulfonate, tetrafluoroborate, and the bis(perfluoroalkylsulfonyl)methides) associated therewith. Examples of useful diazonium cations include 1-diazo-4-anilinobenzene, N-(4-diazo-2,4-dimethoxy phenyl) pyrrolidine, 1-diazo-2,4-diethoxy-4-morpholino benzene, 1-diazo-4-benzoyl amino-2,5-diethoxy benzene, 4-diazo-2,5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053 (Smith) at column 1, line 66, through column 4, line 2, which can be represented by the formulas:

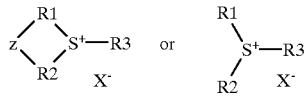

wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, arylsulfonium, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, —S(=O)—, —C(=O)—, —(O=)S(=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —($R_4$—)C(—$R_5$)—, where $R_4$ and $R_5$ are independently selected from the group consisting of hydrogen, alkyl groups having from 1 to about 4 carbon atoms, and alkenyl groups having from about 2 to about 4 carbon atoms. X$^-$ is an anion, as described below.

Suitable anions, X$^-$, for the sulfonium salts (and for any of the other types of photoinitiators) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5-bis(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5-bis(CF_3)C_6H_3)_4B^-$, $(C_6F_5)_4B^-$, $(p-CF_3C_6H_4)_4B^-$, $(m-CF_3C_6H_4)_4B^-$, $(p-FC_6H_4)_4B^-$, $(C_6F_5)_3(CH_3)B^-$, $(C_6F_5)_3(n-C_4H_9)B^-$, $(p-CH_3C_6H_4)_3(C_6F_5)B^-$, $(C_6F_5)_3FB^-$, $(C_6H_5)_3(C_6F_5)B^-$, $(CH_3)_2(p-CF_3C_6H_4)_2B^-$, $(C_6F_5)_3(n-C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5-bis(CF_3)C_6H_3)_4B^-$, $(C_6F_5)_4B^-$, $(C_6F_5)_3(n-C_4H_9)B^-$, and $(C_6F_5)_3(CH_3)B^-$.

Suitable anions containing other metal or metalloid centers include, for example, $(3,5-bis(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, X$^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt photoinitiators include:

triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
p-(phenylthiophenyl)diphenylsulfonium hexafluorophosphate
di-[p-(phenylthiophenyl)]phenylsulfonium hexafluoroantimonate
di-[p-(phenylthiophenyl)]phenylsulfonium hexafluorophosphate 4,4'-bis(diphenylsulfonium)diphenylsulfide bis (hexafluoroantimonate)

4,4'-bis(diphenylsulfonium)diphenylsulfide bis (hexafluorophosphate)

10-methylphenoxathiinium hexafluorophosphate 5-methylthianthrenium hexafluorophosphate 10-phenyl-9,9-dimethylthioxanthenium hexafluorophosphate 10-phenyl-9-oxothioxanthenium tetrafluoroborate 5-methyl-10-oxothianthrenium tetrafluoroborate 5-methyl-10,10-dioxothianthrenium hexafluorophosphate and mixtures thereof.

Preferred sulfonium salts include triaryl-substituted salts such as mixed triarylsulfonium hexafluoroantimonate (for example, UVI-6974 available from Dow Chemical Company), mixed triarylsulfonium hexafluorophosphate (for example, UVI-6990 available from Dow Chemical Company), and arylsulfonium hexafluorophosphate salt (for example, SarCa™ KI85 available from Sartomer Company).

Useful azinium salts include those described in U.S. Pat. No. 4,859,572 (Farid et al.) at column 8, line 51, through column 9, line 46, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the one-photon photosensitizer to the azinium photoinitiator. In one preferred form, the quaternizing substituent is an oxy substituent. The oxy substituent, —O—T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)—$T^1$ radical, where $T^1$ can be any of the various alkyl and aralkyl radicals described above. In addition, $T^1$ can be an aryl radical, such as phenyl or naphthyl. The aryl radical can in turn be substituted. For example, $T^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O—T, contains 1 or 2 carbon atoms. The azinium nuclei need include no substituent other than the quaternizing substituent. However, the presence of other substituents is not detrimental to the activity of these photoinitiators.

Useful triarylimidazolyl dimers include those described in U.S. Pat. No. 4,963,471 (Trout et al.) at column 8, lines 18–28. These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred photoinitiators include iodonium salts (more preferably, aryliodonium salts), chloromethylated triazines, triarylimidazolyl dimers (more preferably, 2,4,5-triphenylimidazolyl dimers), sulfonium salts, and diazonium salts. More preferred are aryliodonium salts, chloromethylated triazines, and the 2,4,5-triphenylimidazolyl dimers (with aryliodonium salts and the triazines being most preferred).

Preparation of Photoreactive Composition

The reactive species, multiphoton photosensitizers (inorganic phosphors), one-photon photosensitizers, electron donor compounds, and photoinitiators can be prepared by the methods described above or by other methods known in the art, and many are commercially available. These components can be combined under "safe light" conditions using any order and manner of combination (optionally, with stirring or agitation), although it is sometimes preferable (from a shelf life and thermal stability standpoint) to add the photoinitiator last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The components of the photoinitiator system are present in photochemically effective amounts (as defined above). Generally, the composition can contain at least about 5% (preferably, at least about 10%; more preferably, at least about 20%) up to about 99.79% (preferably, up to about 95%; more preferably, up to about 80%) by weight of one or more reactive species; at least about 0.01% (preferably, at least about 0.1%; more preferably, at least about 0.2%) up to about 10% (preferably, up to about 5%; more preferably, up to about 2%) by weight of multiphoton photosensitizer (one or more inorganic phosphors); and at least about 0.1% (preferably, at least about 0.2%; more preferably, at least about 0.3%) up to about 15% (preferably, up to about 10%; more preferably, up to about 5%) of the one-photon photoinitiator system. When the one-photon photoinitiator system comprises more than one component, the photoreactive composition can generally contain at least about 0.01% (preferably, at least about 0.1%; more preferably, at least about 0.2%) up to about 10% (preferably, up to about 5%; more preferably, up to about 2%) by weight of one or more one-photon photosensitizers; and either or both of (i) up to about 10% (preferably, up to about 5%) by weight of one or more electron donor compounds (preferably, at least about 0.1%; more preferably, from about 0.1% to about 5%) and (ii) from about 0.1% to about 10% by weight of one or more electron acceptor compounds (preferably, from about 0.1% to about 5%). These percentages are based upon the total weight of solids (that is, the total weight of components other than solvent). When the reactive species is a leuco dye, the composition generally can contain from about 0.01% to about 10% by weight of one or more reactive species (preferably, from about 0.3% to about 10%; more preferably, from about 1% to about 10%; most preferably, from about 2% to about 10%).

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly (methyl methacrylate), poly(styrene)-co-(acrylonitrile), cellulose acetate butyrate, and the like.

Prior to exposure, the resulting photoreactive compositions can be coated on a substrate, if desired, by any of a variety of coating methods known to those skilled in the art (including, for example, knife coating and spin coating). The substrate can be chosen from a wide variety of films, sheets, and other surfaces, depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form.

Exposure System and its Use

Useful exposure systems include at least one light source and at least one optical element. Any light source that provides sufficient intensity (to effect multiphoton absorption) at a wavelength appropriate for the selected multiphoton photosensitizer (for example, a wavelength that is matched with a long-wave length visible or near-infrared absorption band of the photosensitizer's absorber) can be utilized. Such wavelengths can generally be in the range of about 500 to about 1700 nm; preferably, from about 600 to about 1100 nm; more preferably, from about 750 to about 1000 nm. Illumination can be continuous or pulsed or a combination thereof.

One advantage of using up-converting inorganic phosphors as multiphoton photosensitizers is that they can be activated using compact, inexpensive long wavelength visible or near-infrared laser diodes (for example, a 80 mW, 980 nm laser diode available from Semiconductor Laser International) instead of expensive femtosecond or picosecond pulsed laser systems.

Other suitable light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts. Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Peak intensities generally are at least about 10 W/cm$^2$. The upper limit of the pulse fluence is generally dictated by the ablation threshold of the photoreactive composition.

Preferred light sources include near-infrared laser diodes (continuous wave or modulated) and near-infrared pulsed lasers having a pulse length less than about $10^{-8}$ second (more preferably, less than about $10^{-9}$ second; most preferably, less than about $10^{-11}$ second). Other pulse lengths can be used provided that the above-detailed peak intensity and pulse fluence criteria are met. Most preferred light sources are continuous wave near-infrared laser diodes.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, waveplates, and birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20X Fluar).

Generally, exposure of the photoreactive composition can be carried out using a light source (as described above) along with an optical system as a means for controlling the three-dimensional spatial distribution of light intensity within the composition. For example, the light from a continuous wave or pulsed laser can be passed through a focusing lens in a manner such that the focal point is within the volume of the composition. The focal point can be scanned or translated in a three-dimensional pattern that corresponds to a desired shape, thereby creating a three-dimensional image of the desired shape. The exposed or illuminated volume of the composition can be scanned either by moving the composition itself or by moving the light source (for example, moving a laser beam using galvo-mirrors).

If the light induces, for example, a reaction of the reactive species that produces a material having solubility characteristics different from those of the reactive species, the resulting image can optionally be developed by removing either the exposed or the unexposed regions through use of an appropriate solvent, for example, or by other art-known means. Cured, complex, three-dimensional objects can be prepared in this manner.

Exposure times generally depend upon the type of exposure system used to cause image formation (and its accompanying variables such as numerical aperture, geometry of light intensity spatial distribution, the peak light intensity during, for example, the laser pulse (higher intensity and shorter pulse duration roughly correspond to peak light intensity)), as well as upon the nature of the composition exposed (and its concentrations of photosensitizer(s), photoinitiator, and electron donor compound). Generally, higher peak light intensity in the regions of focus allows shorter exposure times, everything else being equal. Linear imaging or "writing" speeds generally can be about 5 to 100,000 microns/second using a continuous wave laser or using a pulsed laser with a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

EXAMPLES

Objects and advantages of this invention are further illustrated by the following examples, but the particular materials and amounts thereof recited in these examples, as well as other conditions and details, should not be construed to unduly limit this invention.

Example 1
Multiphoton-Induced Free Radical Polymerization

An up-converting inorganic phosphor (($Y_{0.86}Yb_{0.08}Er_{0.06})O_2S$, available as Green UC-3 from Allied Signal Inc., Seeize, Germany) was used as a multiphoton photosensitizer for the polymerization of pentaerythritol tetraacrylate (available as SR295 from Sartomer Co., Exton, Pa.) to form a hydrogel. The light output from a 980 nm continuous wave laser diode (80 mW on 9 mm headers with feedback photodiodes; from Semiconductor Laser International of Binghamton, N.Y.) operating at an average power of 50 mW was directed through a focusing lens and used to initiate the polymerization. The focal point spot size of the diode was measured as 50 $\mu$m in diameter. Thus, the power density used to initiate the polymerization with the phosphor was only $2 \times 10^3$ W/cm$^2$. A stock solution of the tetraacrylate was prepared by dissolving 20 g of SR295 in a mixture of 100 g acetonitrile and 25 g of water. A stock solution of photopolymerizable composition was then prepared by adding 140 mg of p-toluenesulfonic acid sodium salt, 170 mg of diphenyl iodonium chloride, and 2.3 mg of rose bengal (4,5,6,7-tetrachloro-2',4',5',7'-tetraiodo fluorescein disodium salt (CAS 632-69-9)), available from Aldrich, Milwaukee, Wis.) to 8 g of the tetraacrylate stock solution. Next, photochemically effective amounts of the up-converting phosphor were dispersed into aliquots of the photopolymerizable composition. Best results were obtained with 30 mg phosphor per gram of photopolymerizable composition. Irradiation of a nitrogen-purged 1 g aliquot of the resulting mixture in a vial using the 980 nm laser diode resulted in visible gelation of the mixture at the focal point of the laser. The sample aliquot was irradiated while spinning it in a vortexer. Within 10 minutes, the entire 1 gram sample had been converted to a gel.

Comparative Example 1
One-Photon-Induced Free Radical Polymerization

Aliquots of the mixture prepared in Example 1, as well as corresponding aliquots with no phosphor content, were exposed to visible light from a projector bulb. All aliquots cured in under 3 seconds, indicating that the phosphor did not significantly inhibit the polymerization process.

Comparative Example 2
Thermally-Induced Free Radical Polymerization

Aliquots of the mixture prepared in Example 1 were stored overnight and, upon inspection, no significant gelation had occurred. This indicates that the phosphor did not significantly catalyze a thermal initiation process.

Example 2
Multiphoton-Induced Cationic Polymerization

Epon™ SU-8 (104.25 g, bisphenol A novalac epoxy resin, available from Resolution Performance Products, Houston, Tex.) is dissolved in propylene glycol methyl ether acetate (PGMEA) (48.5 g, available from Aldrich, Milwaukee, Wis.). 5,7-Diiodo-3-butoxy-6-fluorone (H-Nu 470B, available Spectra Group, Ltd. Maumee, Ohio)(68 mg), 69 mg of (4-(2-hydroxytetradecanoxy)phenyl)phenyl iodonium hexafluoroantimonate (obtained as CD1012 from Sartomer Co., Exton, Pa.), and 5 mg ethyl 4-dimethylaminobenzoate (EDMAB, available from Aldrich, Milwaukee, Wis.) are dissolved in minimal tetrahydrofuran (about 1 g) and added to 10 g of the above SU-8/PGMEA solution with mixing. Up-converting inorganic phosphor, ($Y0.8Yb_{0.2}$ $Tm_{0.00075}$)$F_3$, (34 mg) (up-converting phosphors of this type may be obtained from Allied Signal Inc., Seeize, Germany) is added to the resulting mixture and suspended by stirring. The resulting mixture is coated by spin coating on silicon wafers, previously primed with 2-(2,3-epoxycyclohexyl)ethyl trimethoxysilane, and the solvent evaporated in a 60° C. oven overnight, followed by 10 minutes at 80° C.

The resulting coated silicon wafers are exposed using a 980 nm continuous wave laser diode operating at 50 mW (described in Example 1) and a motorized, computer-controlled XY translation stage. Each coated silicon wafer is placed on the translation stage so that the photopolymer coating on the silicon wafer is at the focal point of the laser beam. The stage is moved in a pattern to generate a series of 6 squares, 1 mm×1 mm, each square composed of 2 sets of 1 mm, perpendicular lines with 50 micron spacing. The first square is written by moving the stage at 6 mm/min. Subsequent squares are written moving the stage at 8.5, 12, 17, 24, and 34 mm/min. After exposure, the wafer is baked at 100° C. for 5 minutes on a hot plate. The image is developed by dipping in PGMEA for about 1 minute and allowed to dry. Lines of cured epoxy corresponding to the location of the laser spot during exposure are apparent.

Example 3
Writing an Image by Multiphoton-Induced Free Radical Polymerization A stock solution of poly(methyl methacrylate) (PMMA) in dichloroethane was prepared by mixing 90 g poly(methyl methacrylate) (PMMA having a molecular weight of 120,000, available from Aldrich, Milwaukee, Wis.) with 368 g 1,2-dichloroethane, and mixing with stirring overnight. The resulting PMMA stock solution (15 g) was mixed with 3.5 g tris(2-hydroxyethyl)isocyanurate triacrylate (available as SR368 from Sartomer Co., Exton, Pa.) and 3.5 g alkoxylated trifunctional acrylate ester (available as SR 9008 from Sartomer Co., Exton, Pa.), and the resulting mixture warmed and stirred, forming an acrylate stock solution. 13 mg rose bengal, 13.6 mg 4-(2-hydroxytetradecanoxy)phenylphenyl iodonium hexafluoroantimonate (obtained as CD1012 from Sartomer Co., Exton, Pa.), and 14.3 mg tetramethylammonium n-butyltriphenylborate (available as CGI 437 from Ciba Specialties Chemicals Corp., Tarrytown, N.Y.), were mixed with 0.3 g tetrahydrofuran to form a photoinitiator system concentrate. To the concentrate was added 3 g of the acrylate stock solution with stirring to form a solution, and then 14 mg of the up-converting phosphor, ($Y_{0.86}Yb_{0.08}Er_{0.06})O_2S$ (Green UC-3), was added and the resulting mixture shaken to disperse the phosphor, forming a coating solution.

Microscope slides (5.1 cm×7.7 cm) were cleaned and treated with 3-trimethoxysilylpropyl methacrylate (available from Aldrich, Milwaukee, Wis.) by dipping the slides in a slightly acidic, 2 weight % solution of 3-trimethoxysilylpropyl methacrylate in 95% ethanol. The treated slides were dried in an oven at 80° C. for approximately 2 hours. The treated slides were coated with the coating solution by spin coating at 1000 RPM for 20 seconds, and dried overnight in an oven at 60° C.

The resulting coated slides were exposed using a 980 nm continuous wave laser diode operating at 50 mW (described in Example 1) and a motorized, computer-controlled XY translation stage. Each coated slide was placed on the translation stage so that the photopolymer coating on the slide was at the focal point of the laser beam. The stage was moved in a pattern to generate a series of 6 squares, 1 mm×1 mm, each square composed of 2 sets of 1 mm, perpendicular lines with 50 micron spacing. The first square was written by moving the stage at 6 mm/min. Subsequent squares were written moving the stage at 8.5, 12, 17, 24, and 34 mm/min. The resulting images were developed by dipping the exposed slide in propylene glycol methyl ether acetate for approximately 2 min, removing the slide, and evaporating the solvent under a gentle stream of nitrogen. All six 1 mm×1 mm squares were visible after development.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A multiphoton-activatable, photoreactive composition comprising (a) at least one reactive species that is capable of undergoing an acid- or radical-initiated chemical reaction; (b) a photochemically-effective amount of a multiphoton photosensitizer comprising at least one multiphoton up-converting inorganic phosphor; and (c) a photochemically-effective amount of a one-photon photoinitiator system that is capable of being photosensitized by said multiphoton photosensitizer.

2. The composition of claim 1 wherein said reactive species is a curable species.

3. The composition of claim 2 wherein said curable species is selected from the group consisting of monomers, oligomers, reactive polymers, and mixtures thereof.

4. The composition of claim 3 wherein said curable species is selected from the group consisting of addition-polymerizable monomers and oligomers, addition-crosslinkable polymers, cationically-polymerizable monomers and oligomers, cationically-crosslinkable polymers, and mixtures thereof.

5. The composition of claim 1 wherein said reactive species is a non-curable species.

6. The composition of claim 1 wherein said multiphoton up-converting inorganic phosphor comprises at least one host material that is doped with at least one rare earth activator couple.

7. The composition of claim 6 wherein said host material is selected from the group consisting of metal oxysulfides, metal oxyhalides, metal fluorides, metal gallates, metal silicates, metal aluminates, metal phosphates, metal oxides, metal vanadates, and mixtures thereof.

8. The composition of claim 6 wherein said rare earth activator couple comprises an absorber that is ytterbium and an emitting center that is selected from the group consisting of erbium, holmium, terbium, thulium, and mixtures thereof.

9. The composition of claim 8 wherein the molar ratio of said absorber to said emitter is at least about 1:1.

10. The composition of claim 1 wherein said multiphoton up-converting inorganic phosphor is capable of multiphoton absorption of long-wavelength visible or near-infrared radiation and single-photon emission of ultraviolet or visible radiation.

11. The composition of claim 1 wherein said multiphoton up-converting inorganic phosphor is in the form of particles having an average diameter less than about 7 microns.

12. The composition of claim 11 wherein said particles have been coated or treated with at least one surface-active, compatibilizing agent.

13. The composition of claim 1 wherein said multiphoton up-converting inorganic phosphor is selected from the group consisting of those represented by the following formulas: $Na(Y_xYb_yEr_z)F_4$, where x is 0.7 to 0.9, y is 0.09 to 0.29, and z is 0.05 to 0.01; $Na(Y_xYb_yHo_z)F_4$, where x is 0.7 to 0.9, y is 0.0995 to 0.2995, and z is 0.0005 to 0.001; $Na(Y_xYb_yTm_z)F_4$, where x is 0.7 to 0.9, y is 0.0995 to 0.2995, and z is 0.0005 to 0.001; $(Y_xYb_yEr_z)O_2S$, where x is 0.7 to 0.9, y is 0.05 to 0.12, and z is 0.05 to 0.12; and $(Y_{0.86}Yb_{0.08}Er_{0.06})_2O_3$.

14. The composition of claim 13 wherein said multiphoton up-converting inorganic phosphor is $(Y_{0.86}Yb_{0.08}Er_{0.06})O_2S$.

15. The composition of claim 1 wherein said one-photon photoinitiator system comprises a photochemically effective amount of at least one one-photon photoinitiator that has an electronic absorption band that overlaps with an up-converted electronic emission band of said multiphoton photosensitizer.

16. The composition of claim 15 wherein said one-photon photoinitiator is selected from the group consisting of free-radical photoinitiators that generate a free radical source and cationic photoinitiators that generate an acid when exposed to ultraviolet or visible radiation.

17. The composition of claim 16 wherein said free-radical photoinitiators are selected from the group consisting of acetophenones, benzophenones, aryl glyoxalates, acylphosphine oxides, benzoin ethers, benzil ketals, thioxanthones, chloroalkyltriazines, bisimidazoles, triacylimidazoles, pyrylium compounds, sulfonium salts, iodonium salts, mercapto compounds, quinones, azo compounds, organic peroxides, and mixtures thereof; and said cationic photoinitiators are selected from the group consisting of metallocene salts having an onium cation and a halogen-containing complex anion of a metal or metalloid, metallocene salts having an organometallic complex cation and a halogen-containing complex anion of a metal or metalloid, iodonium salts, sulfonium salts, and mixtures thereof.

18. The composition of claim 1 wherein said one-photon photoinitiator system comprises photochemically effective amounts of (1) at least one one-photon photosensitizer having an electronic absorption band that overlaps with an up-converted electronic emission band of said multiphoton photosensitizer; and (2) either or both of (i) at least one electron donor compound different from said one-photon photosensitizer and capable of donating an electron to an electronic excited state of said one-photon photosensitizer; and (ii) at least one photoinitiator that is capable of being photosensitized by accepting an electron from an electronic excited state of said one-photon photosensitizer, resulting in the formation of at least one free radical and/or acid.

19. The composition of claim 18 wherein said composition comprises both said electron donor compound and said photoinitiator.

20. The composition of claim 18 wherein said one-photon photosensitizer is capable of absorbing light within the range of wavelengths between about 300 and about 800 nanometers and is capable of sensitizing 2-methyl-4,6-bis(trichloromethyl)-s-triazine.

21. The composition of claim 18 wherein said one-photon photosensitizer is selected from the group consisting of ketones, coumarin dyes, xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes, pyridinium dyes, and mixtures thereof.

22. The composition of claim 18 wherein said one-photon photosensitizer is selected from the group consisting of xanthene dyes, ketones, ketocoumarins, aminoarylketones, p-substituted aminostyryl ketone compounds, and mixtures thereof.

23. The composition of claim 18 wherein said one-photon photosensitizer is selected from the group consisting of rose bengal, camphorquinone, glyoxal, biacetyl, 3,3,6,6-tetramethylcyclohexanedione, 3,3,7,7-tetramethyl-1,2-cycloheptanedione, 3,3,8,8-tetramethyl-1,2-cyclooctanedione, 3,3,18,18-tetramethyl-1,2-cyclooctadecanedione, dipivaloyl, benzil, furil, hydroxybenzil, 2,3-butanedione, 2,3-pentanedione, 2,3-hexanedione, 3,4-hexanedione, 2,3-heptanedione, 3,4-heptanedione, 2,3-octanedione, 4,5-octanedione, 1,2-cyclohexanedione, and mixtures thereof.

24. The composition of claim 18 wherein said electron donor compound has an oxidation potential that is greater than zero and less than or equal to that of p-dimethoxybenzene.

25. The composition of claim 18 wherein said electron donor compound has an oxidation potential between about 0.3 and 1 volt vs. a standard saturated calomel electrode.

26. The composition of claim 18 wherein said electron donor compound is selected from the group consisting of amines, amides, ethers, ureas, sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$borates (n+m=4), $SnR_4$ compounds (where each R is independently chosen from the group consisting of alkyl, aralkyl, aryl, and alkaryl groups), ferrocene, and mixtures thereof.

27. The composition of claim 26 wherein said electron donor compound is selected from the group consisting of amines that contain one or more julolidinyl moieties, alkylarylborate salts, salts of aromatic sulfinic acids, 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, 1,2,4-trimethoxybenzene, and mixtures thereof.

28. The composition of claim 18 wherein said composition contains no said electron donor compound.

29. The composition of claim 18 wherein said photoinitiator is selected from the group consisting of iodonium salts, sulfonium salts, diazonium salts, azinium salts, chloromethylated triazines, triarylimidazolyl dimers, and mixtures thereof.

30. The composition of claim 29 wherein said photoinitiator is selected from the group consisting of iodonium salts, chloromethylated triazines, triarylimidazolyl dimers, sulfonium salts, diazonium salts, and mixtures thereof.

31. The composition of claim 30 wherein said photoinitiator is selected from the group consisting of aryliodonium salts, chloromethylated triazines, 2,4,5-triphenylimidazolyl dimers, and mixtures thereof.

32. The composition of claim 1 wherein said composition comprises from about 5% to about 99.79% by weight of said reactive species, from about 0.01% to about 10% by weight of said multiphoton photosensitizer, and from about 0.1% to about 15% by weight of said one-photon photoinitiator system.

33. The composition of claim 1 wherein said composition further comprises at least one adjuvant selected from the group consisting of solvents, diluents, resins, binders, plasticizers, pigments, dyes, inorganic or organic reinforcing or extending fillers, thixotropic agents, indicators, inhibitors, stabilizers, ultraviolet absorbers, and medicaments.

34. A multiphoton-activatable, photoreactive composition comprises: (a) at least one curable species that is capable of undergoing a radical-initiated chemical reaction; (b) a photochemically-effective amount of a multiphoton photosensitizer comprising at least one multiphoton up-converting inorganic phosphor represented by the general formula $(Y_xYb_yEr_z)O_2S$, where x is 0.7 to 0.9, y is 0.05 to 0.12, and z is 0.05 to 0.12; and (c) photochemically effective amounts of (1) rose bengal; (2) at least one alkylarylborate salt; and (3) at least one iodonium salt.

35. A method of multiphoton photosensitizing comprising the steps of
   (a) preparing a multiphoton-activatable, photoreactive composition comprising
      (1) at least one reactive species that is capable of undergoing an acid- or radical-initiated chemical reaction;
      (2) a photochemically-effective amount of a multiphoton photosensitizer comprising at least one multiphoton up-converting inorganic phosphor; and
      (3) a photochemically-effective amount of a one-photon photoinitiator system that is capable of being photosensitized by said multiphoton photosensitizer; and
   (b) irradiating said composition with light sufficient to cause sequential or simultaneous absorption of at least two photons, thereby inducing at least one acid- or radical-initiated chemical reaction where said composition is exposed to the light.

36. The method of claim 35 wherein said irradiating is carried out using a continuous wave laser source.

37. The method of claim 35 wherein said irradiating is carried out using a laser diode.

38. The method of claim 35 wherein said irradiating is pulse irradiating.

39. The method of claim 38 wherein said pulse irradiating is carried out using a near infrared pulsed laser having a pulse length less than about $10^{-8}$ second.

40. The method of claim 35 wherein said method provides linear imaging speeds of about 5 to about 100,000 microns/second.

41. The method of claim 35 wherein said absorption is sequential.

* * * * *

UNITED STATES PATENT AND TRADEMARK OFFICE
CERTIFICATE OF CORRECTION

PATENT NO. : 6,750,266 B2  Page 1 of 1
APPLICATION NO. : 10/033507
DATED : June 15, 2004
INVENTOR(S) : James G. Bentsen It is certified that error appears in the above-identified patent and that said Letters Patent is hereby corrected as shown below:

Column 16
Line 7, delete "bomanedione" and insert -- bornanedione --, therefor.

Column 19
Line 30, delete "ArB(CH$_3$)$_3$$^{31}$N(CH$_3$)$_4$$^+$" and insert -- ArB(CH$_3$)$_3^-$N(CH$_3$)$_4^+$ --, therefor.

Line 31, delete "(n-C$_4$H$_9$)$_4$B$^{31}$N(CH$_3$)$_4$+" and insert -- (n-C$_4$H$_9$)$_4$B$^-$N(CH$_3$)$_4$+ --, therefor.

Column 20
Line 37, delete "OH$^{31}$" and insert -- OH$^-$ or --, therefor.

Column 22
Line 22, insert -- (C$_6$F$_5$)$_3$FB$^-$, -- before "and".

Column 25
Line 60, delete "10 W/cm2" and insert -- 10$^6$ W/cm$^2$ --, therefor.

Column 28
Line 1, delete "(Y0.8Yb$_{0.2}$Tm $_{0.00075}$)" and insert -- (Y$_{0.8}$Yb$_{0.2}$Tm $_{0.00075}$) --, therefor.

Signed and Sealed this

Nineteenth Day of February, 2008

JON W. DUDAS
*Director of the United States Patent and Trademark Office*